(12) United States Patent
Hsu et al.

(10) Patent No.: US 6,238,958 B1
(45) Date of Patent: May 29, 2001

(54) METHOD FOR FORMING A TRANSISTOR WITH REDUCED SOURCE/DRAIN SERIES RESISTANCE

(75) Inventors: Kirk Hsu, Hsin-Chu; Yung-Chang Lin, Feng-Yuan; Wen-Jeng Lin, Pan-Chiao, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/477,109

(22) Filed: Dec. 31, 1999

(51) Int. Cl.$^7$ .................................................. H01L 21/84
(52) U.S. Cl. ............................................................ 438/163
(58) Field of Search .................................... 438/163, 197, 438/199, 231, 232, 514, 527, 721, 755

(56) References Cited

U.S. PATENT DOCUMENTS 6,133,124 * 10/2000 Horstmann et al. .................. 438/525

* cited by examiner

Primary Examiner—David Nelms
Assistant Examiner—Quoc Hoang

(57) ABSTRACT

A method for forming a transistor in integrated circuits is disclosed. The method includes the following steps. A substrate is first provided. An insulating layer is then formed on the substrate. A conductor layer is formed on the insulating layer. Subsequently, a patterned photoresist layer is formed on the conductor layer. Next, an etch process is used to etch the conductor layer which has a sidewall. The patterned photoresist layer is then removed. After forming a liner layer on the sidewall of the conductor layer, a lightly doped drain is formed on and in the substrate. Then, a spacer is formed on the liner layer. Thereafter, a proper process is used to introduce ions into the lightly doped drain, and then a source/drain region is completed. The steps with follow include annealing the source/drain region and removing the spacer. Subsequently, an epi-silicon layer is formed on the lightly doped drain region, the source/drain region and the top surface of the conductor layer. Finally, the epi-silicon layer is treated with a salicidation process to form a salicide layer.

20 Claims, 5 Drawing Sheets

METHOD FOR FORMING A TRANSISTOR WITH REDUCED SOURCE/DRAIN SERIES RESISTANCE

BACKGROUND OF THE INVENTION

1. Field of the Invention

The present invention relates to the method for fabricating a semiconductor device. More particularly, the present invention relates to the method for fabricating a transistor in integrated circuits.

2. Description of the Prior Art

According to conventional knowledge, a transistor of integrated circuits is fabricated by the following method.

Referring to FIG. 1, first, a silicon substrate 11 is provided. Then after a shallow trench isolation (STI) 12 is formed on the substrate 11 by any conventional process, a well (n-type or p-type) 13 is formed on and in the substrate 11 by ion implantation or by any other conventional process. A gate oxide layer 14 is then formed on the substrate by rapid thermal oxidation (RTO) or any other conventional process. Subsequently, a poly-silicon layer 15 is formed on the gate oxide layer 14 by chemical vapor deposition (CVD). After forming a patterned photoresist 16 on the poly-silicon layer 15, an etch process is used to etch the poly-silicon layer 15 and the gate oxide layer 14. Therein the pattern, having the pattern of a gate region, serves as an etching mask to protect the underlying portion of the etched layers. Thereafter, the photoresist 16 is stripped away. The residual poly-silicon layer 15 serves as a gate electrode of a gate in the semiconductor transistor.

Referring to FIG. 2, the poly-silicon layer 15 has a sidewall formed after an etch process. The next step is to introduce ions onto and into the substrate 11 by an ion implantation process to form a lightly doped drain (LDD) region 17.

Referring to FIG. 3, chemical vapor deposition (CVD) or another appropriate process is used to form an oxide liner layer 18 on all surfaces including the top and sidewall of the poly-silicon layer 15, and the top of the substrate 11. Subsequently, a silicon nitride layer 19 is deposited on the oxide liner layer 18 by a chemical vapor deposition (CVD) process and then etched back.

Referring to FIG. 4, the residual silicon nitride layer 19 serves as a spacer against the conductor layer 15 and is about 1000 angstroms thick. Then, ion implantation is used to introduce ions into the lightly doped drain (LDD) region 17 of the substrate 11 to form a source/drain region 20.

Referring to FIG. 5, the exposed silicon surfaces, including the top of the gate electrode 15 and the top of the substrate 11, are treated by a salicidation process. The salicide layer 21 is then completed.

Referring to FIG. 6, the salicide layer 21 is used to reduce the resistance of the silicon surfaces and to facilitate the contact process. In the use of the transistor structure fabricated by this convention method, at least a series resistance appears in the path through which the current is conducted. The series resistance includes a pair of contact resistance $R_c$, a channel resistance $R_{ch}$ and a pair of extra resistance $R_{ext}$. The contact resistance $R_c$ part, due to nature of salicide, extends from the site at which the node contact is located to the edge of the salicide layer 21 against the nitride spacer 19. The channel resistance $R_{ch}$ part, existing in the channel region under the gate, extends from edge of the source LDD region to the one of the drain LDD region. And the extra resistance $R_{ext}$, existing inside of the LDD region, is located under the nitride spacer (about 1000 angstroms).

According to the trend of reducing the size of integrated circuits, the effects of the series resistance is becoming more and more obvious and can be less and less ignored for the device's driving current. The effects include reducing the running speed of integrated circuits and causing a high temperature during running.

For the foregoing reasons described above, there is a need to develop a method for fabricating a transistor that can reduce the series resistance, particularly the part of the series resistance in the non-salicide region. This improvement would enable the running speed of the integrated circuits to be enhanced, thus the increased temperature during running can be reduced.

SUMMARY OF THE INVENTION

In accordance with the present invention, a method is provided for forming a transistor with less series resistance that substantially enhances the running speed of integrated circuits and reduces their running temperature. In one embodiment, a silicon substrate is first provided. A gate oxide layer is then formed on the substrate. A conductor layer, such as poly-silicon, is formed on the gate oxide layer. Subsequently, a patterned photoresist layer is formed on the poly-silicon layer. Next, an etch process is used to etch the poly-silicon layer which has a sidewall. The patterned photoresist layer is then removed by stripping process. After forming a liner layer on the sidewall of the poly-silicon layer, a lightly doped drain is formed on and in the substrate by ion implantation. Then, a spacer is formed on the liner layer. Thereafter, an appropriate process is used to introduce ions into the lightly doped drain, and then a source/drain region is completed. The steps which follow are annealing the source/drain region and removing the spacer. Subsequently, an epi-silicon layer is formed on the lightly doped drain region, the source/drain region and the top surface of the poly-silicon layer. Finally, the epi-silicon layer is treated with a salicidation process to form a salicide layer.

The transistor fabricated by the present invention has less series resistance than transistors fabricated by conventional methods, and will not suffer increased temperatures during running the integrated circuits.

BRIEF DESCRIPTION OF THE DRAWINGS

The foregoing aspects and many of the attendant advantages of the present invention will become more readily appreciated as the same becomes better understood by reference to the following detailed description, when taken in conjunction with the accompanying drawings, wherein.

DESCRIPTION OF THE PREFERRED EMBODIMENT

The extra resistance $R_{ext}$ (in the LDD under the conventional spacer) is very high according to known technology. The present invention provides a method for manufacturing a transistor in integrated circuits to solve the problem, which is described below.

Figure 1:
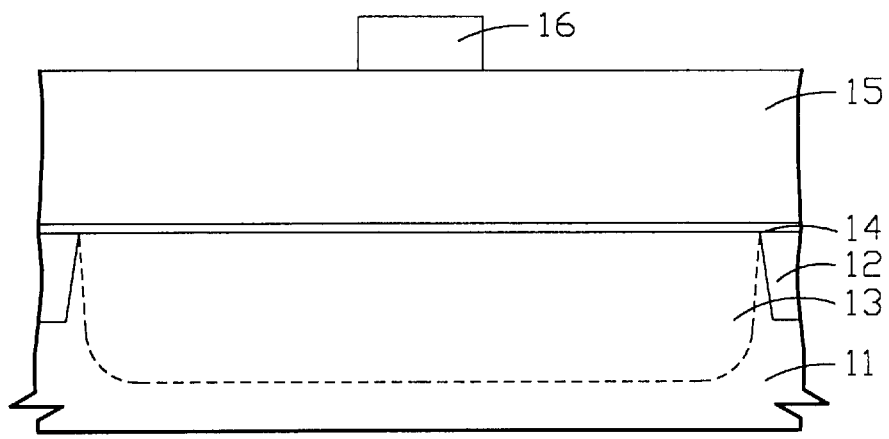
FIGS. 1–5 show the steps of fabricating a transistor according to conventional methods.
Figure 2:
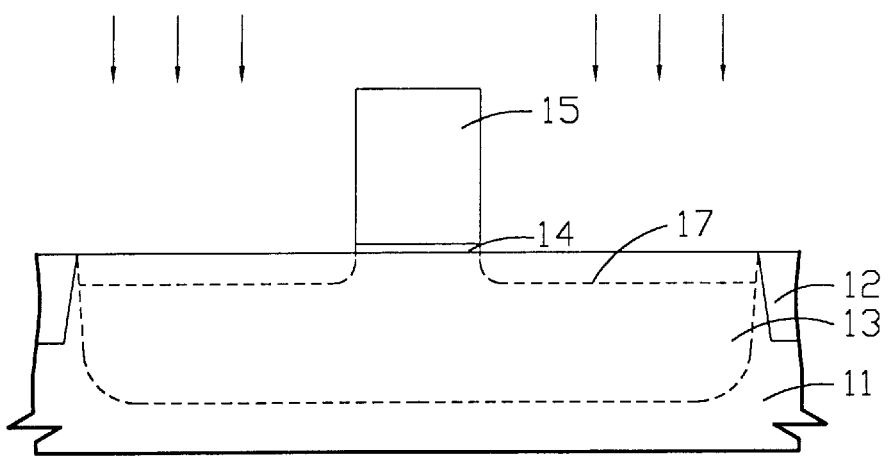
Figure 3:
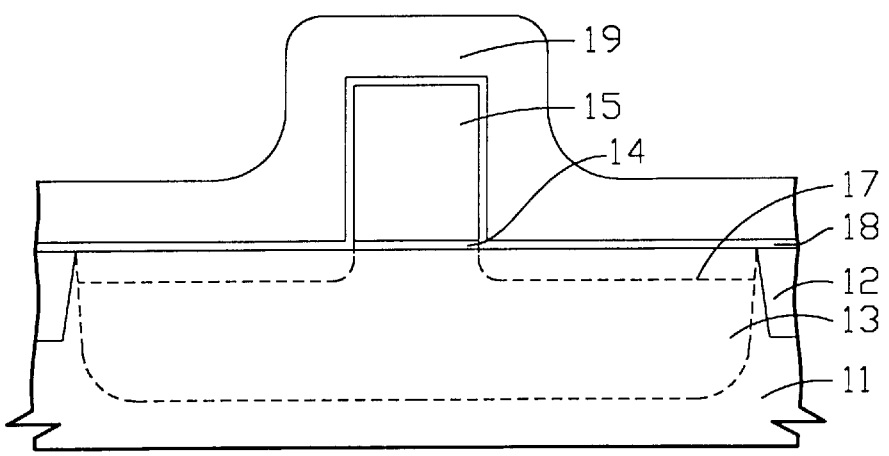
Figure 4:
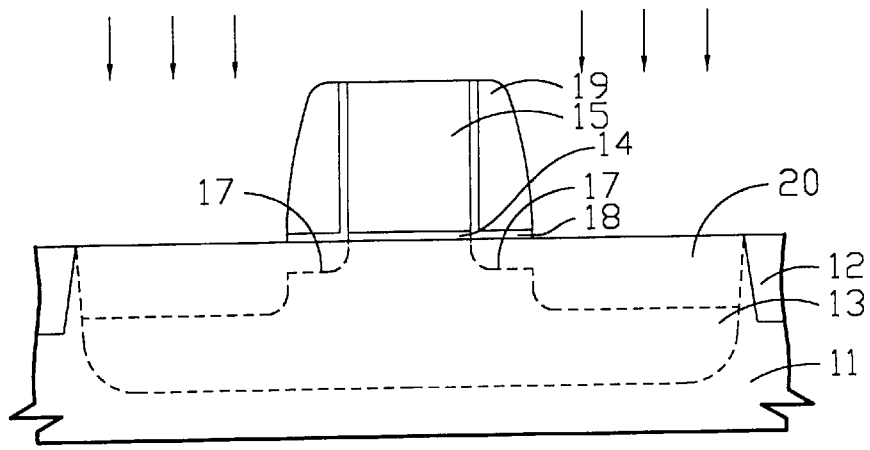
Figure 5:
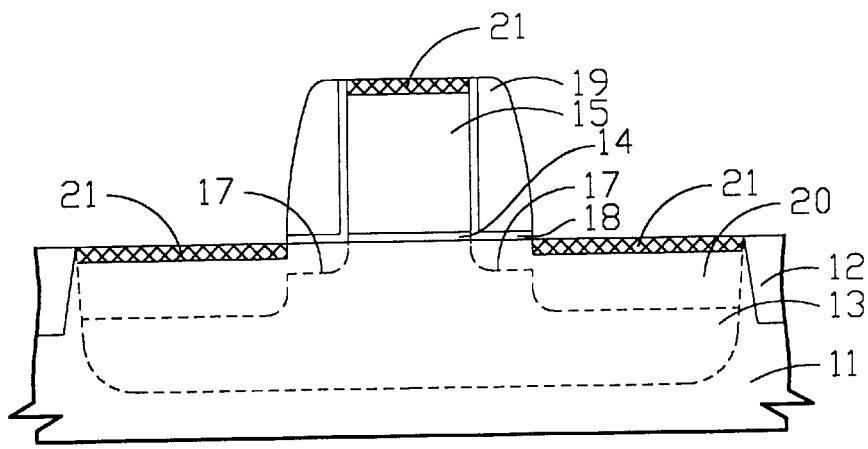
Figure 6:
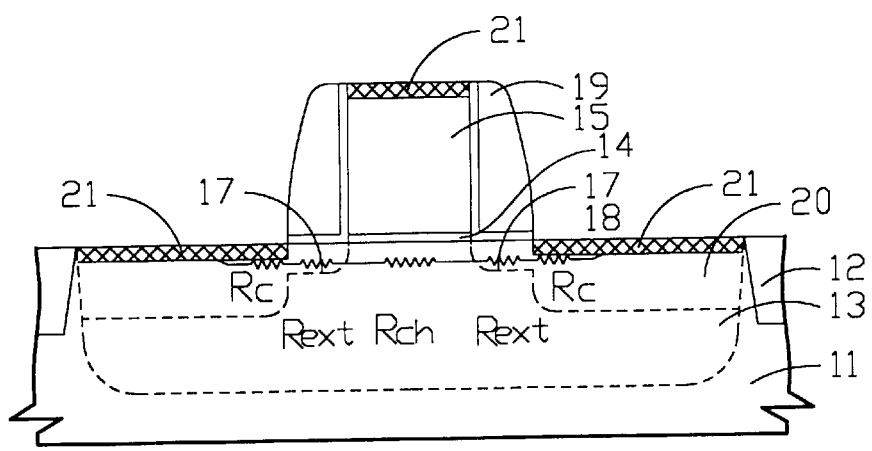
FIG. 6 shows mainly the resistance parts in the non-salicide region, including a $R_{ch}$ and a pair of $R_{ext}$.
Figure 7:
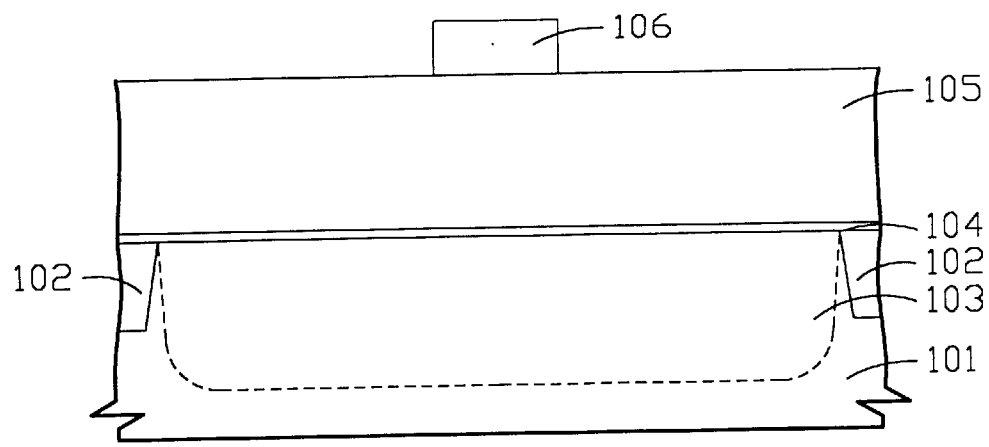
FIGS. 7–13 show the steps of fabricating a transistor according to the present invention.

Referring to FIG. 7, first, a substrate 101 such as a silicon substrate is provided. Then a shallow trench isolation (STI)

102 is formed on the substrate 101 by any conventional process to isolate any two different active areas. A well (n-type or p-type) 103 is formed on and in the substrate 101 by ion implantation or by any other conventional process. A gate oxide layer 104 is formed on the substrate by thermal oxidation or by any other conventional process. Subsequently, a conductor layer 105, such as poly-silicon, silicide or metal, is formed on the gate oxide layer 104 by chemical vapor deposition (CVD). After forming a patterned photoresist 106 on the conductor layer 105, an etch process is used to etch the conductor layer 105 and the gate oxide layer 104. Therein the patterned photoresist 106, having the pattern of a gate region, serves as an etching mask to protect the underlying portion of the etched layers. Thereafter, the photoresist 106 is stripped away. The residual conductor layer 105 serves as a gate electrode of a gate in the transistor.

Figure 8:
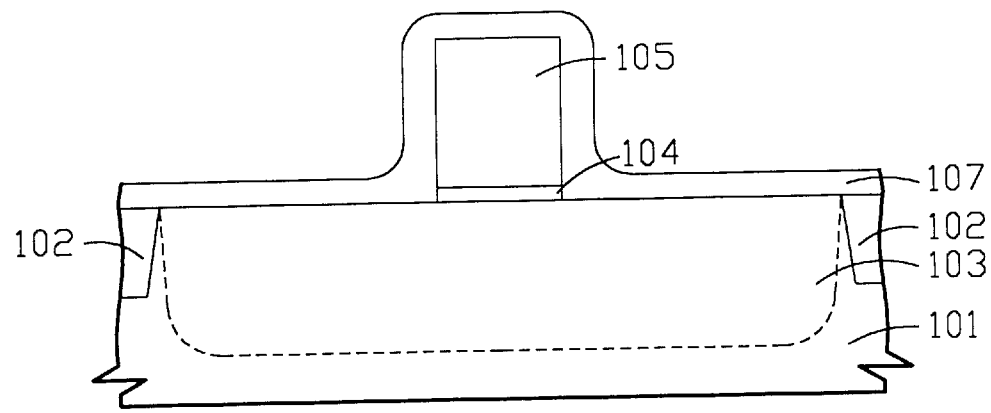

As shown in FIG. 8, the conductor layer 105 has a sidewall after etching. The next step is to form a liner layer on the sidewall of the conductor layer 105. A silicon nitride layer 107 is deposited on all surfaces of the conductor layer 105 and the substrate 101, and is then etched back.

Figure 9:
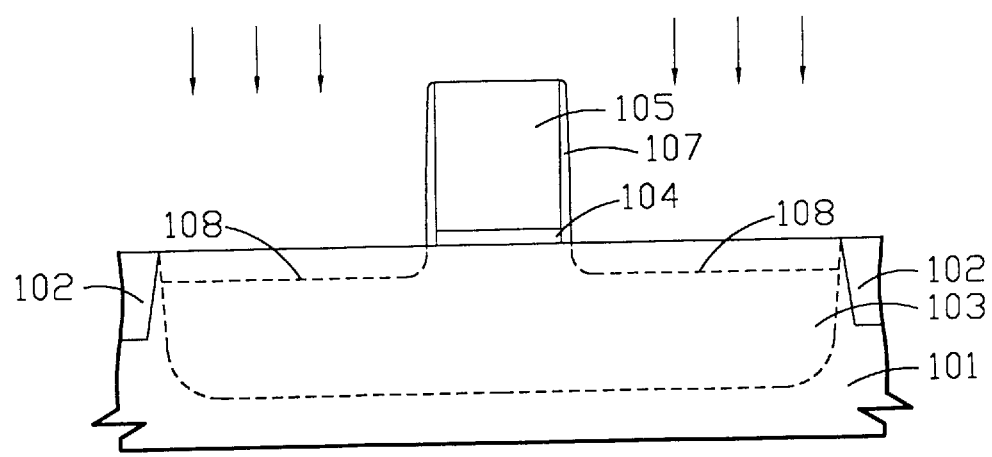

Referring to FIG. 9, the silicon nitride layer 107, now etched back, is about 100–300 angstroms thick. Subsequently, an ion implantation process is used to introduce ions onto and into the substrate 101 to form a lightly doped drain (LDD) region 108. The etched conductor layer 105 and the silicon nitride layer are used as a mask.

Figure 10:
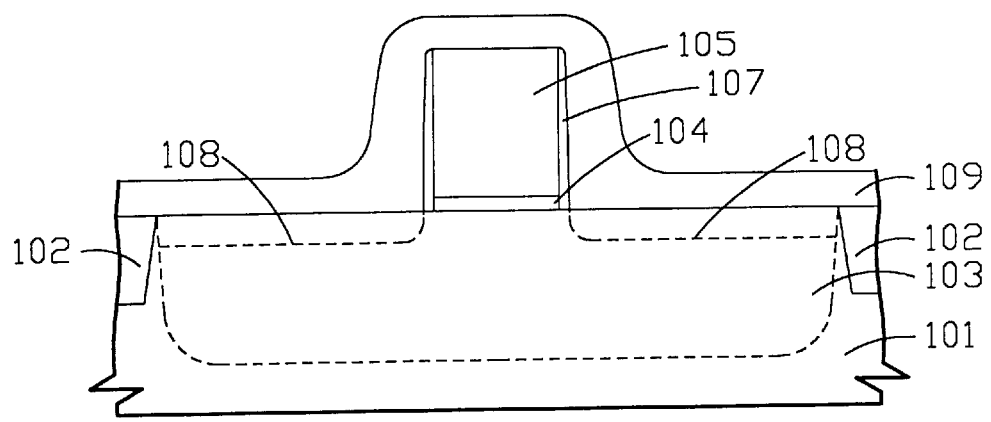

Referring to FIG. 10, an oxide layer 109 is deposited on all surfaces, including the top of the conductor layer 105, the surface of the liner layer 107 and the top of the substrate 101. The oxide layer 109 can be formed by a chemical vapor deposition process.

Figure 11:
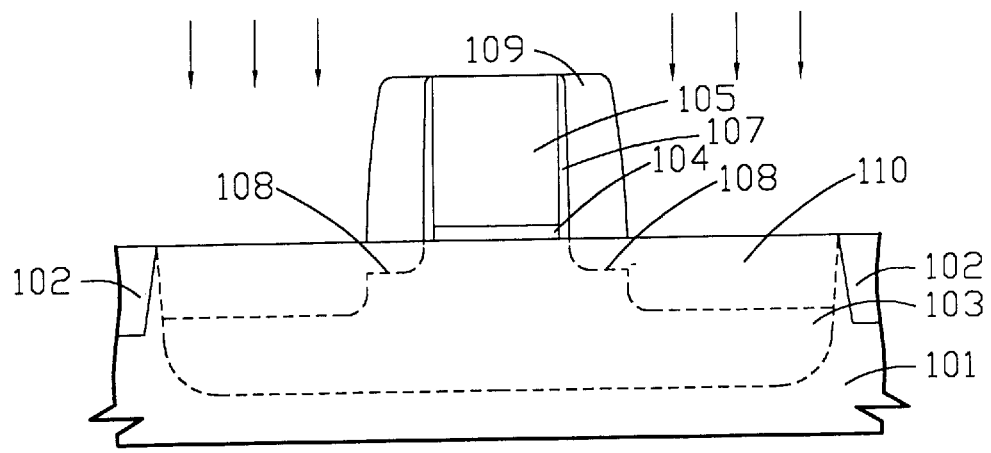

Referring to FIG. 11, an etch back process is used to etch back the oxide layer 109. The etched back oxide layer serves as a spacer against the conductor layer 105. Then, ion implantation or any other conventional process and an annealing process are used to introduce ions (n- or p-type) into the LDD region 108 of the substrate 101 to form a source/drain region 110. The implanted ions have the same kind of charge as the LDD region. Subsequently, the oxide spacer 109 is removed by stripping or etching or any other appropriate process. Moreover, at this point, the removing process generally employs HF. According to the present invention, the oxide spacer 109 is used just to protect the underlying portion of the LDD region from forming the source/drain region.

Figure 12:
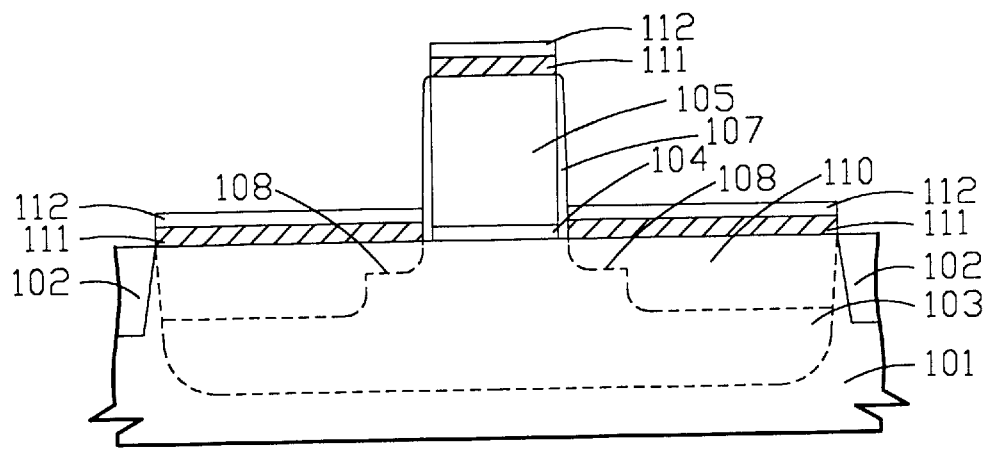
Figure 13:
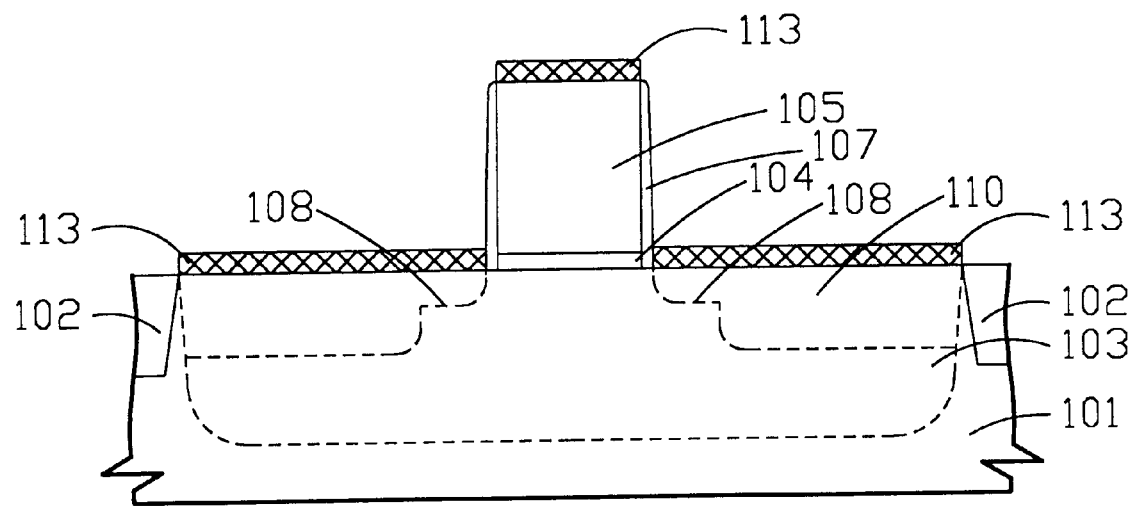

Referring to FIG. 12, to form a salicide layer on all silicon surfaces, a selective epi-silicon layer 111, about 300–1000 angstroms thick, is first deposited on all silicon surfaces, such as on the top of the silicon substrate 101 and the top of the conductor layer 105 (when poly-silicon is chosen). Next, the epi-silicon layer should be treated with a salicidation process such that a metal 112 such as Ti or Co is formed on the epi-silicon layer 111 by chemical vapor deposition (CVD). A thermal process is then used to diffuse the metal 112 into the epi-silicon layer 111 to finally complete a salicide layer 113 as shown in FIG. 13.

Figure 14:
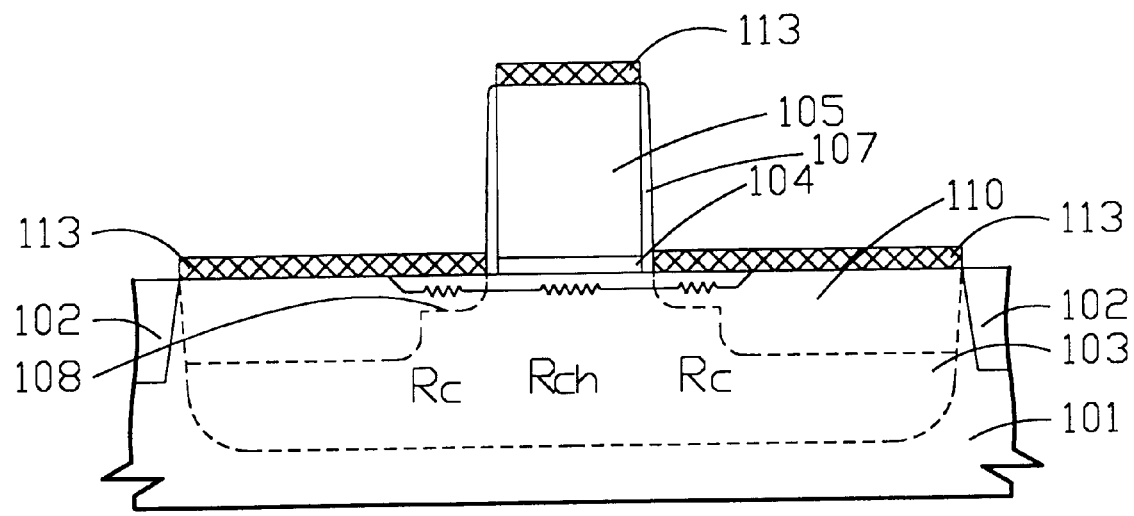
FIG. 14 shows mainly that the $R_{ext}$ is almost canceled when the present invention is utilized.

Referring to FIG. 14, members of the series resistance formed by the present invention are mainly illustrated. A pair of contact resistance $R_c$ and a channel resistance $R_{ch}$ are indicated. According to the present invention, the length of the region under the "protector" of the gate electrode, such as the liner layer mentioned above, is shorter than the prior art. The extra resistance $R_{ext}$ is almost canceled due to the modification using only the liner layer instead of both the liner layer and the spacer according to previously known technology. The whole series resistance is thus reduced.

Although specific embodiments have been illustrated and described, it will be obvious to those skilled in the art that various modifications may be made without departing from what is intended to be limited solely by the appended claims.

What is claimed is:

1. A method for manufacturing a transistor in integrated circuits, comprising:

providing a substrate;

forming an insulating layer on said substrate;

forming a conductor layer on said insulating layer;

forming a patterned photoresist layer on said conductor layer;

using said patterned photoresist layer as a mask to etch said conductor layer, said conductor layer having a sidewall;

removing said patterned photoresist layer;

forming a liner layer on said sidewall of said conductor layer;

introducing first ions to form a lightly doped drain region on and in said substrate by using said liner layer and the etched conductor layer as a mask;

forming a spacer on said liner layer;

introducing second ions into said lightly doped drain region to form a source/drain region by using said spacer, said liner layer and said etched conductor layer as a mask;

removing said spacer;

forming an epi-silicon layer on said lightly doped drain region, said source/drain region and top surface of said conductor layer; and treating said epi-silicon layer with a salicidation process to form a salicide layer.

2. The method according to claim 1, wherein said substrate comprises silicon.

3. The method according to claim 1, wherein said insulating layer comprises a gate oxide layer.

4. The method according to claim 3, wherein said gate oxide layer is formed by thermal oxidation process.

5. The method according to claim 1, wherein said conductor layer comprises one of the following: poly-silicon, silicide and metal.

6. The method according to claim 1, wherein said conductor layer is formed by deposition process.

7. The method according to claim 1, wherein said liner layer is formed by deposition and etch back processes.

8. The method according to claim 1, wherein said liner layer comprises silicon nitride.

9. The method according to claim 1, wherein said liner layer has the thickness of about 100 to 300 angstroms.

10. The method according to claim 1, wherein said lightly doped drain region is formed by ion implantation process.

11. The method according to claim 1, wherein said spacer is formed by deposition and etch back processes.

12. The method according to claim 1, wherein said spacer comprises oxide.

13. The method according to claim 1, wherein said source/drain region is formed by ion implantation process.

14. The method according to claim 1, wherein said spacer is removed by striping process.

15. The method according to claim 1, wherein said spacer is removed by etch process.

16. The method according to claim 1, wherein said epi-silicon layer comprises selective epi-silicon.

17. The method according to claim 1, wherein said epi-silicon layer is formed by deposition process.

18. The method according to claim 1, wherein said epi-silicon layer has the thickness of about 300 to 1000 angstroms.

19. The method according to claim 1, wherein said salicidation process comprises:

depositing a metal on said epi-silicon layer; and diffusing said metal into said epi-silicon layer by a thermal process.

20. The method according to claim 19, wherein said metal comprises one of the following: Ti and Co.

* * * * *